United States Patent
Miyamoto

(10) Patent No.: US 6,470,203 B2
(45) Date of Patent: Oct. 22, 2002

(54) MR IMAGING METHOD, PHASE ERROR MEASURING METHOD AND MRI SYSTEM

(75) Inventor: Shoei Miyamoto, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 94 days.

(21) Appl. No.: 09/770,041

(22) Filed: Jan. 25, 2001

(65) Prior Publication Data

US 2001/0017544 A1 Aug. 30, 2001

(30) Foreign Application Priority Data

Feb. 25, 2000 (JP) .................... 2000-048512

(51) Int. Cl.[7] ................................ A61B 5/05
(52) U.S. Cl. ........................ 600/410; 714/798
(58) Field of Search ..................... 600/410, 407, 600/408, 409, 411, 412, 113, 414, 415, 416, 417, 418, 419, 420, 421, 422, 423; 324/307; 436/73; 714/798

(56) References Cited

U.S. PATENT DOCUMENTS

| | | | | |
|---|---|---|---|---|
| 4,644,280 A | * | 2/1987 | Paltiel | 324/307 |
| 4,982,160 A | * | 1/1991 | Hagiwara | 324/307 |
| 5,081,992 A | * | 1/1992 | Levin et al. | 324/307 |
| 5,199,435 A | * | 4/1993 | Sugimoto et al. | 600/410 |
| 5,270,652 A | * | 12/1993 | Dixon et al. | 324/309 |
| 5,722,409 A | * | 3/1998 | Kuhara et al. | 324/306 |
| 5,853,365 A | * | 12/1998 | Yamagata | 324/306 |
| 6,023,634 A | * | 2/2000 | Hanawa et al. | 324/307 |
| 6,038,466 A | * | 3/2000 | Haselhoff | 324/309 |
| 6,091,242 A | * | 7/2000 | Hanawa | 324/300 |

FOREIGN PATENT DOCUMENTS

| | | |
|---|---|---|
| EP | 0595391 | 5/1994 |
| EP | 0818689 | 1/1998 |

OTHER PUBLICATIONS

Boesch Ch Et Al "Temporal and Spatial Analysis of fields generated by eddy currets . . . etc" Magnetic Reosnance in Medicine, Academic Press, vol. 20, No. 21 Aug. 91, pp. 268–284.

Alexander Al Et Al "Elimination of eddy current artifacts in diffusion . . . etc" Magnetic resonance in Medicine, Academic Press, vol. 38, No. 6, Dec. 1, 1997 pp. 1016–1021.

* cited by examiner

Primary Examiner—Teresa Walberg
Assistant Examiner—Daniel Robinson
(74) Attorney, Agent, or Firm—Moonray Kojima

(57) ABSTRACT

The present invention aims to reduce degradation in image quality due to residual magnetization. In a pulse sequence of a high-speed spin echo process, a pre-pulse is applied before an excitation pulse, and a correction pulse for correcting a phase error caused by the pre-pulse is applied before an initial inversion pulse.

20 Claims, 11 Drawing Sheets

Phase error measuring pre-scan sequence of encode 0 with positive stationary pre-pulse Phase error measuring pre-scan sequence of encode +e to -e with negative stationary pre-pulse Phase error measuring pre-scan sequence of encode +e with negative stationary pre-pulse Phase error measuring pre-scan sequence of encode -e with negative stationary pre-pulse Imaging sequence Imaging sequence

MR IMAGING METHOD, PHASE ERROR MEASURING METHOD AND MRI SYSTEM

BACKGROUND OF THE INVENTION

The present invention relates to an MR imaging method, a phase error measuring method, and an MRI (Magnetic Resonance Imaging) system, and more specifically to an MR imaging method capable of reducing degradation in image quality due to residual magnetization, a phase error measuring method for measuring a phase error developed due to the residual magnetization, and an MRI system which executes these methods.

The following prior arts have been disclosed in Japanese Patent Application Laid-Open No. H10-75940.

(1) A phase error measuring method of executing a pre-scan sequence for transmitting an excitation pulse, transmitting an inversion pulse, applying a phase encoding pulse to a phase axis, applying a read pulse to a read axis, applying a rewind pulse to the phase axis, subsequently transmitting an inversion pulse, applying a dephaser pulse to the phase axis, and collecting data from echoes while applying a read pulse to the phase axis, and thereby measuring a phase error of each subsequent echo, which is developed due to the influence of eddy currents and residual magnetization caused by a phase encoding pulse, etc., based on phase data obtained by converting the collected data into one-dimensional Fourier form, and (2) An MR imaging method of, in a pulse sequence of a high-speed spin echo process for transmitting an inversion pulse after the transmission of an excitation pulse, applying a phase encoding pulse to a phase axis, collecting data from echoes while applying a read pulse to a read axis, repeating the application of a rewind pulse to the phase axis plural times while the phase encoding pulse is being changed, thereby collecting data from a plurality of echoes by one excitation, building a compensating pulse for compensating for the amount of the phase error measured by the phase error measuring method described in the above (1) in its corresponding phase encoding pulse, adding the same to one or both immediately before or after the phase encoding pulse, incorporating the same in its corresponding rewind pulse, or adding the same to one or both immediately before or after the rewind pulse.

Each of the prior arts is based on the precondition that the amount of the phase error measured by the phase error measuring method of the above (1) and the amount of the phase error developed when no compensating pulse is added in the pulse sequence of the high-speed spin echo process described in the above (2), are equal to each other.

However, a problem arises in that since the residual magnetization at the commencement of the measurement of the phase error and the residual magnetization at the commencement of the pulse sequence of the high-speed spin echo process are not always equal to each other, the precondition employed in the prior art is not established, and the phase error occurs due to the residual magnetization, thus causing degradation in image quality.

SUMMARY OF THE INVENTION

An object of the present invention is to provide an MR imaging method capable of reducing degradation in image quality due to residual magnetization, a phase error measuring method for measuring a phase error developed due to the residual magnetization, and an MRI system for executing these methods.

According to a first aspect, the present invention provides an MR imaging method using a high-speed spin echo process, comprising the steps of transmitting an inversion pulse after the transmission of an excitation pulse, applying a phase encoding pulse to a phase axis, collecting data from echoes while applying a read pulse to a read axis, repeating the application of a rewind pulse to the phase axis plural times while changing the phase encoding pulse, collecting data from a plurality of echoes by one excitation, applying a pre-pulse to an arbitrary gradient axis before an excitation pulse, and applying a correction pulse for correcting a phase error caused by the pre-pulse to the phase axis before or behind the initial inversion pulse or adding the amount of correction for correcting a phase error caused by the pre-pulse to the initial inversion pulse.

In the MR imaging method according to the first aspect, the pre-pulse is applied to the arbitrary gradient axis before the excitation pulse. Owing to the pre-pulse, residual magnetization at the commencement of a pulse sequence of the high-speed spin echo process can be controlled. Further, the correction pulse for correcting the phase error developed due to the residual magnetization is applied to the phase axis before or behind the initial inversion pulse, or the amount of correction for correcting the phase error caused by the pre-pulse is added to the initial inversion pulse. Thus, the influence of the residual magnetization at the commencement of the pulse sequence of the high-speed spin echo process can be restrained and degradation in image quality due to the residual magnetization can be reduced.

According to a second aspect, the present invention provides an MR imaging method wherein in the MR imaging method according to the first aspect, the amount of correction for correcting the amount of a phase error caused by a phase encoding pulse is added to its corresponding rewind pulse or phase encoding pulse lying immediately after the rewind pulse or a correction pulse for correcting the amount of a phase error caused by a phase encoding pulse is added before or behind the corresponding rewind pulse.

In the MR imaging method according to the second aspect, residual magnetization at the commencement of a pulse sequence of the high-speed spin echo process can be restrained and the phase error caused by the phase encoding pulse can be corrected, thus making it possible to reduce degradation in image quality, which is developed due to it.

According to a third aspect, the present invention provides an MR imaging method using a high-speed spin echo process, for transmitting an inversion pulse after the transmission of an excitation pulse, applying a phase encoding pulse to a phase axis, collecting data from echoes while applying a read pulse to a read axis, repeating the application of a rewind pulse to the phase axis plural times while changing the phase encoding pulse, thereby collecting data from a plurality of echoes by one excitation, applying a pre-pulse to an arbitrary gradient axis before an excitation pulse, and adding the amount of correction for correcting a phase error caused by the pre-pulse to the initial phase encoding pulse or the initial rewind pulse.

In the MR imaging method according to the third aspect, the pre-pulse is applied to the arbitrary gradient axis before the excitation pulse. Owing to the pre-pulse, residual magnetization at the commencement of a pulse sequence of the high-speed spin echo process can be controlled. Further, the amount of correction for correcting the phase error developed due to the residual magnetization is added to the initial phase encoding pulse or the initial rewind pulse. Thus, the influence of the residual magnetization at the commencement of the pulse sequence of the high-speed spin echo process can be restrained and degradation in image quality due to the residual magnetization can be reduced.

According to a fourth aspect, the present invention provides an MR imaging method wherein in the MR imaging method according to the third aspect, the amount of correction for correcting the amount of a phase error caused by a phase encoding pulse is added to the corresponding rewind pulse or phase encoding pulse lying immediately after the rewind pulse or a correction pulse for correcting the amount of a phase error caused by a phase encoding pulse is added to the front or back of the corresponding rewind pulse.

In the MR imaging method according to the fourth aspect, the influence of residual magnetization at the commencement of a pulse sequence of the high-speed spin echo process can be restrained, the phase error caused by the phase encoding pulse can be corrected, and degradation in image quality, which is developed due to it, can be reduced.

According to a fifth aspect, the present invention provides a phase error measuring method comprising the following steps of:

(1) applying a pre-pulse to an arbitrary gradient axis, transmitting an excitation pulse, transmitting a first inversion pulse, subsequently transmitting a second inversion pulse, applying a dephaser pulse to a phase axis, collecting data from echoes while applying a read pulse to the phase axis, applying a rephaser pulse, subsequently transmitting a third inversion pulse, applying a dephaser pulse to the phase axis, collecting data from echoes while applying a read pulse to the phase axis, and determining the amount of a phase error, based on the collected data;

(2) applying a pre-pulse to an arbitrary gradient axis, transmitting an excitation pulse, transmitting a first inversion pulse, applying a phase encoding pulse to a phase axis, applying a rewind pulse to the phase axis, subsequently transmitting a second inversion pulse, applying a dephaser pulse to the phase axis, collecting data from echoes while applying a read pulse to the phase axis, applying a rephaser pulse, subsequently transmitting a third inversion pulse, applying a dephaser pulse to the phase axis, collecting data from echoes while applying a read pulse to the phase axis, and determining the amount of a phase error, based on the collected data.

(3) applying a pre-pulse to an arbitrary gradient axis, transmitting an excitation pulse, transmitting a first inversion pulse, applying a phase encoding pulse opposite in polarity to the above (2) to a phase axis, applying a rewind pulse to the phase axis, subsequently transmitting a second inversion pulse, applying a dephaser pulse to the phase axis, collecting data from echoes while applying a read pulse to the phase axis, applying a rephaser pulse, subsequently transmitting a third inversion pulse, applying a dephaser pulse to the phase axis, collecting data from echoes while applying a read pulse to the phase axis, and determining the amount of a phase error, based on the collected data;

(4) applying a pre-pulse opposite in polarity to the above (1) to an arbitrary gradient axis, transmitting an excitation pulse, transmitting a first inversion pulse, subsequently transmitting a second inversion pulse, applying a dephaser pulse to a phase axis, collecting data from echoes while applying a read pulse to the phase axis, applying a rephaser pulse, subsequently transmitting a third inversion pulse, applying a dephaser pulse to the phase axis, collecting data from echoes while applying a read pulse to the phase axis, and determining the amount of a phase error, based on the collected data; and (5) determining the amount of a phase error caused by the pre-pulse, based on the amount of the phase error obtained from each of the above (1) to (4).

The phase error obtained from the collected data includes three factors of a component $\Delta\Phi_0$ (principally caused by residual magnetization at the commencement of a pulse sequence) activated from the commencement of the pulse sequence to the initial inversion pulse, a component $\Delta\Phi_z$ (principally caused by the residual magnetization at the commencement of the pulse sequence) from the initial inversion pulse to the next inversion pulse or $\Delta\Phi_n$ (principally caused by a phase encoding pulse), and a component $\alpha$ caused by a read pulse.

In the phase error measuring method according to the fifth aspect, the amount of a phase error $\Phi_{128-}$ including three factors of $\Delta\Phi_0$, $-\Delta\Phi_z$ and $\alpha$ is determined from the above (1). The amount of a phase error $\Phi_{1+}$ including three factors of $-\Delta\Phi_0$, $-\Delta\Phi_n$ and $\alpha$ is determined from the above (2). The amount of a phase error $\Phi_{256+}$ including three factors of $-\Delta\Phi_0$, $\Delta\Phi_n$ and $\alpha$ is determined from the above (3). Further, the amount of a phase error $\Phi_{128+}$ including three factors of $-\Delta\Phi_0$, $\Delta\Phi_z$ and $\alpha$ is determined from the above (4). Namely, the following equations are obtained.

$$\Phi_{128-}=\Delta\Phi_0-\Delta\Phi_z+\alpha$$

$$\Phi_{n+}=-\Delta\Phi_0-\Delta\Phi_{(n)}+\alpha$$

$$\Phi_{(256-n+1)+}=-\Delta\Phi_0+\Delta\Phi_{(n)}+\alpha$$

$$\Phi_{128+}=-\Delta\Phi_0+\Delta\Phi_z+\alpha$$

If they are solved from the above (5), then the amount of the phase error $\Delta\Phi_0$ developed due to the residual magnetization at the commencement of the pulse sequence can be obtained from the following equation.

$$\Delta\Phi_0=(\Phi_{128-}+\Phi_{128+})/2-(\Phi_{n+}+\Phi_{(256-n+)+})/2$$

According to a sixth aspect, the present invention provides a phase error measuring method wherein in the phase error measuring method according to the fifth aspect, the amount of a phase error caused by the phase encoding pulse is determined based on the amount of the phase error obtained from each of the above (2) and (3).

In the phase error measuring method according to the sixth aspect, the amount of a phase error $\Delta\Phi_{(n)}$ caused by a phase encoding pulse can be obtained from $\Phi_{n+}$ determined from the above (2) and $\Phi_{(256-n+1)+}$ determined from the above (3) as follows:

$$\Delta\Phi_{(n)}=(\Phi_{(256-n+1)+}-\Phi_{n+})/2$$

According to a seventh aspect, the present invention provides an MRI system, which comprises RF pulse transmitting means, gradient pulse applying means and NMR signal receiving means, which executes MR imaging by a high-speed spin echo process for controlling the respective means to thereby transmit an inversion pulse after the transmission of an excitation pulse, apply a phase encoding pulse to a phase axis, collect data from echoes while a read pulse is being applied to a read axis, repeat the application of a rewind pulse to the phase axis plural times while changing the phase encoding pulse and collect data from a plurality of echoes by one excitation, and which includes pre-pulse applying means for applying a pre-pulse to an arbitrary gradient axis before the excitation pulse, and pre-pulse correcting means for applying a correction pulse for correcting a phase error caused by the pre-pulse to the phase axis before or behind the initial inversion pulse or adding the amount of correction for correcting the phase error caused by the pre-pulse to the initial inversion pulse.

The MRI system according to the seventh aspect can suitably execute the MR imaging method according to the first aspect.

According to an eighth aspect, the present invention provides an MRI system, which in the MRI system according to the seventh aspect, includes phase encoding pulse correcting means for adding the amount of correction for correcting the amount of a phase error caused by a phase encoding pulse to the corresponding rewind pulse or phase encoding pulse lying immediately after the rewind pulse or adding a correction pulse for correcting the amount of a phase error caused by a phase encoding pulse to the front or back of the corresponding rewind pulse.

The MRI system according to the eighth aspect can suitably execute the MR imaging method according to the second aspect.

According to a ninth aspect, the present invention provides an MRI system, which comprises RF pulse transmitting means, gradient pulse applying means, and NMR signal receiving means, which executes MR imaging by a high-speed spin echo process for controlling the respective means to thereby transmit an inversion pulse after the transmission of an excitation pulse, apply a phase encoding pulse to a phase axis, collect data from echoes while a read pulse is being applied to a read axis, repeat the application of a rewind pulse to the phase axis plural times while changing the phase encoding pulse and collect data from a plurality of echoes by one excitation, and which includes pre-pulse applying means for applying a pre-pulse to an arbitrary gradient axis before the excitation pulse, and pre-pulse correcting means for adding the amount of correction for correcting a phase error caused by the pre-pulse to the initial phase encoding pulse or the initial rewind pulse.

The MRI system according to the ninth aspect can suitably execute the MR imaging method according to the third aspect.

According to a tenth aspect, the present invention provides an MRI system, which in the MRI system according to the ninth aspect, includes phase encoding pulse correcting means for adding the amount of correction for correcting the amount of a phase error caused by a phase encoding pulse to the corresponding rewind pulse or phase encoding pulse lying immediately after the rewind pulse or adding a correction pulse for correcting the amount of a phase error caused by a phase encoding pulse to the front or back of the corresponding rewind pulse.

The MRI system according to the ninth aspect can suitably execute the MR imaging method according to the third aspect.

According to an eleventh aspect, the present invention provides an MRI system, which in the MRI system according to each of the seventh through tenth aspects, includes phase error measuring means, which performs the steps of:

(1) applying a pre-pulse to an arbitrary gradient axis, transmitting an excitation pulse, transmitting a first inversion pulse, subsequently transmitting a second inversion pulse, applying a dephaser pulse to a phase axis, collecting data from echoes while applying a read pulse to the phase axis, applying a rephaser pulse, subsequently transmitting a third inversion pulse, applying a dephaser pulse to the phase axis, collecting data from echoes while applying a read pulse to the phase axis, and determining the amount of a phase error, based on the collected data;

(2) applying a pre-pulse to an arbitrary gradient axis, transmitting an excitation pulse, transmitting a first inversion pulse, applying a phase encoding pulse to a phase axis, applying a rewind pulse to the phase axis, subsequently transmitting a second inversion pulse, applying a dephaser pulse to the phase axis, collecting data from echoes while applying a read pulse to the phase axis, applying a rephaser pulse, subsequently transmitting a third inversion pulse, applying a dephaser pulse to the phase axis, collecting data from echoes while applying a read pulse to the phase axis, and determining the amount of a phase error, based on the collected data.

(3) applying a pre-pulse to an arbitrary gradient axis, transmitting an excitation pulse, transmitting a first inversion pulse, applying a phase encoding pulse opposite in polarity to the above (2) to a phase axis, applying a rewind pulse to the phase axis, subsequently transmitting a second inversion pulse, applying a dephaser pulse to the phase axis, collecting data from echoes while applying a read pulse to the phase axis, applying a rephaser pulse, subsequently transmitting a third inversion pulse, applying a dephaser pulse to the phase axis, collecting data from echoes while applying a read pulse to the phase axis, and determining the amount of a phase error, based on the collected data;

(4) applying a pre-pulse opposite in polarity to the above (1) to an arbitrary gradient axis, transmitting an excitation pulse, transmitting a first inversion pulse, subsequently transmitting a second inversion pulse, applying a dephaser pulse to a phase axis, collecting data from echoes while applying a read pulse to the phase axis, applying a rephaser pulse, subsequently transmitting a third inversion pulse, applying a dephaser pulse to the phase axis, collecting data from echoes while applying a read pulse to the phase axis, and determining the amount of a phase error, based on the collected data; and (5) determining the amount of a phase error caused by the pre-pulse, based on the amount of the phase error obtained from each of the above (1) to (4).

The MRI system according to the eleventh aspect can suitably execute the phase error measuring method according to the fifth aspect.

According to a twelfth aspect, the present invention provides an MRI system wherein in the MRI system according to the eleventh aspect, the phase error measuring means determines the amount of a phase error caused by the phase encoding pulse, based on the amount of the phase error obtained from each of the above (2) and (3).

The MRI system according to the twelfth aspect can suitably execute the phase error measuring method according to the sixth aspect.

According to an MR imaging method of the present invention, the influence of residual magnetization at the commencement of a pulse sequence of a high-speed spin echo process can be retrained and hence degradation in image quality can be reduced.

According to a phase error measuring method of the present invention, it is possible to suitably measure a phase error caused by the influence of residual magnetization at the commencement of a pulse sequence of a high-speed spin echo process.

Further, according to an MRI system of the present invention, the above-described method can suitably be executed.

Further objects and advantages of the present invention will be apparent from the following description of the preferred embodiments of the invention as illustrated in the accompanying drawings.

DETAILED DESCRIPTION OF THE INVENTION

Figure 1:
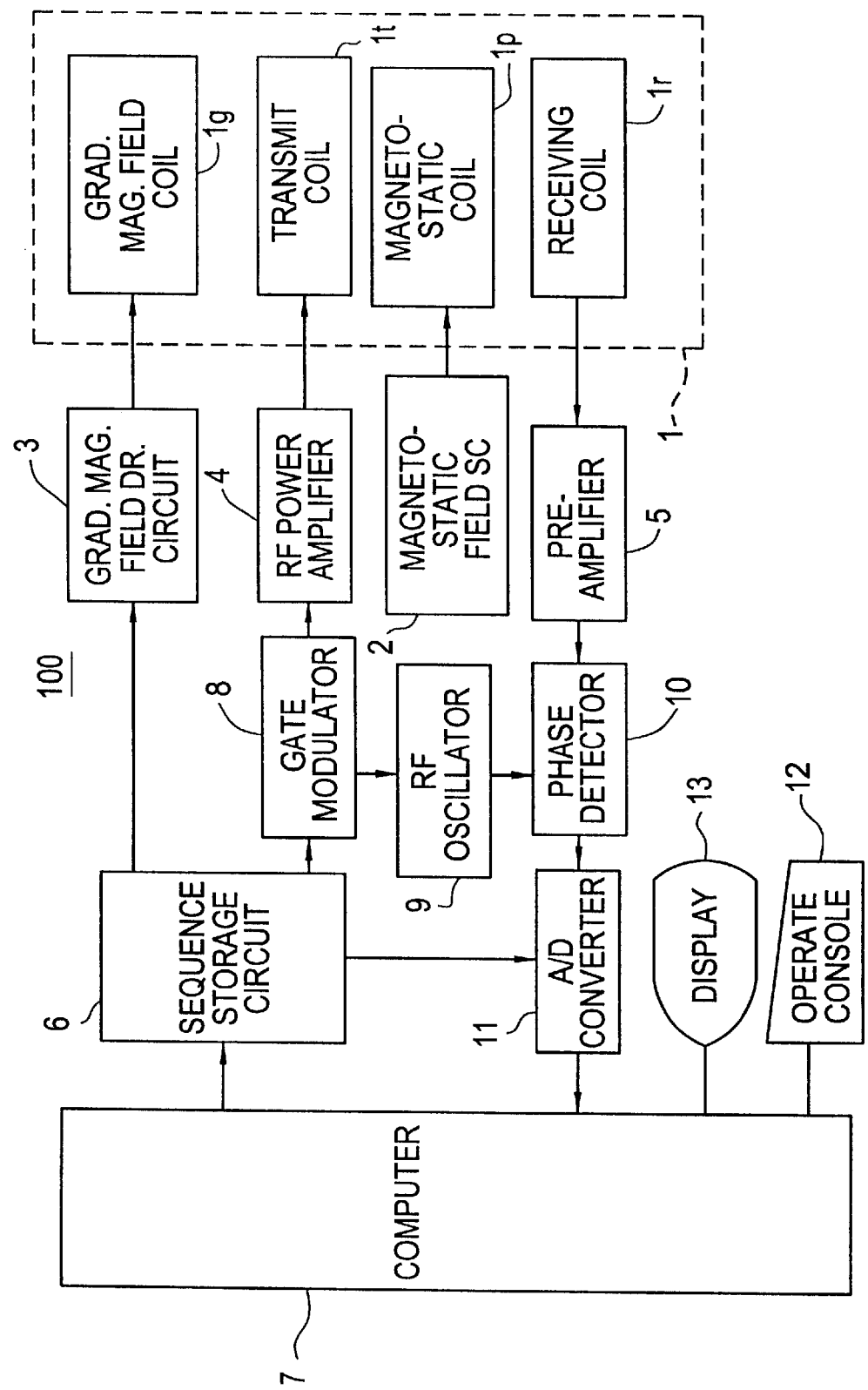
FIG. 1 is a block diagram showing an MRI system according to the present invention.

The present invention will hereinafter be described in further details by embodiments illustrated in the drawings.

First Embodiment

FIG. 1 is a block diagram showing an MRI system according to a first embodiment of the present invention.

In the present MRI system 100, a magnet assembly 1 has a space (hole) for inserting a sample therein and is provided with a magnetostatic field coil 1$p$ for applying a constant static magnetic field to the sample, a gradient or gradient magnetic field coil 1$g$ for generating gradient or gradient magnetic fields for a slice axis, a read axis and a phase axis, a transmitting coil 1$t$ for supplying a RF pulse for exciting the spin of a nucleus in the sample, and a receiving coil 1$r$ for detecting an NMR signal from the sample, so as to surround the space. The magnetostatic field coil 1$p$, gradient magnetic field coil 1$g$, transmitting coil 1$t$ and receiving coil 1$r$ are respectively electrically connected to a magnetostatic field source 2, a gradient or gradient magnetic field driving circuit 3, a RF power amplifier 4 and a pre-amplifier 5.

Incidentally, a permanent magnet may be used in place of the magnetostatic field coil 1$p$.

A sequence storage circuit 6 controls or operates the gradient magnetic field driving circuit 3, based on a pulse sequence stored therein in accordance with instructions given from a computer 7 to thereby generate a gradient magnetic field from the gradient magnetic field coil 1$g$ of the magnet assembly 1. Further, the sequence storage circuit 6 operates a gate modulator 8 to modulate a carrier output signal produced from a RF oscillator 9 to a pulsated signal represented in the form of a predetermined timing and predetermined envelope and adds it to the RF power amplifier 4 as a RF pulse, where it is power-amplified. Thereafter, the RF power amplifier 4 applies the pulse to the transmitting coil 1$t$ of the magnet assembly 1 to select and excite a desired slice region.

The pre-amplifier 5 amplifies an NMR signal from the sample, which is detected by the receiving coil 1$r$ of the magnet assembly 1, and inputs the amplified NMR signal to a phase detector 10. The phase detector 10 receives a carrier output signal produced from the RF oscillator 9 as a reference signal, phase-detects the NMR signal supplied from the pre-amplifier 5 and supplies it to an A/D converter 11. The A/D converter 11 converts the phase-detected analog signal to a digital signal and inputs it to the computer 7.

The computer 7 reads data from the A/D converter 11 and performs an image reconstructing computation on the data to thereby generate an image for a desired slice region. The image is displayed on a display unit 13. Further, the computer 7 takes charge of the whole control such as the reception of information inputted through an operation console 12.

Figure 2:
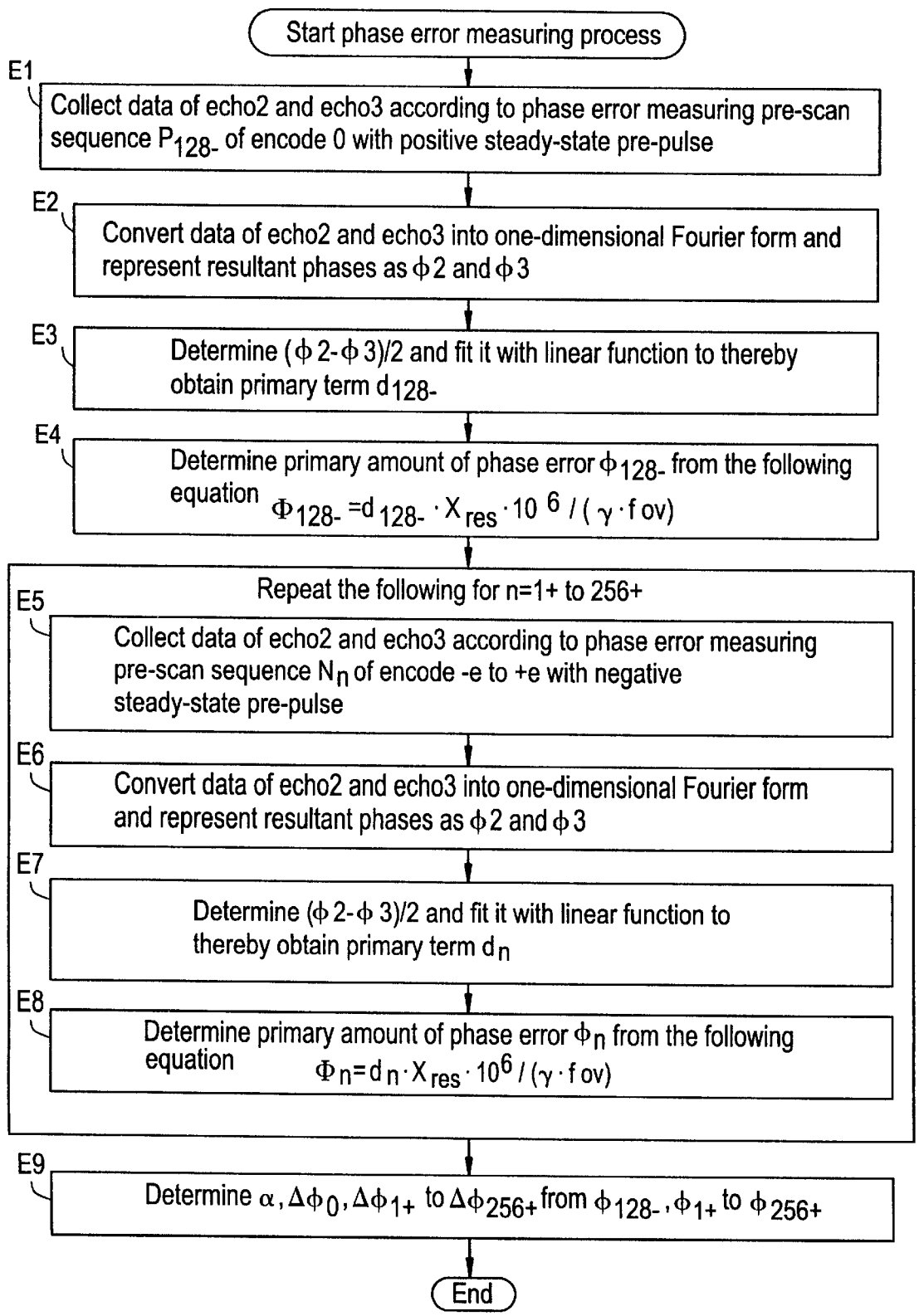
FIG. 2 is a flowchart illustrating a phase error measuring process according to the present invention.

FIG. 2 is a flowchart for describing a phase error measuring process according to the present invention.

Figure 3:
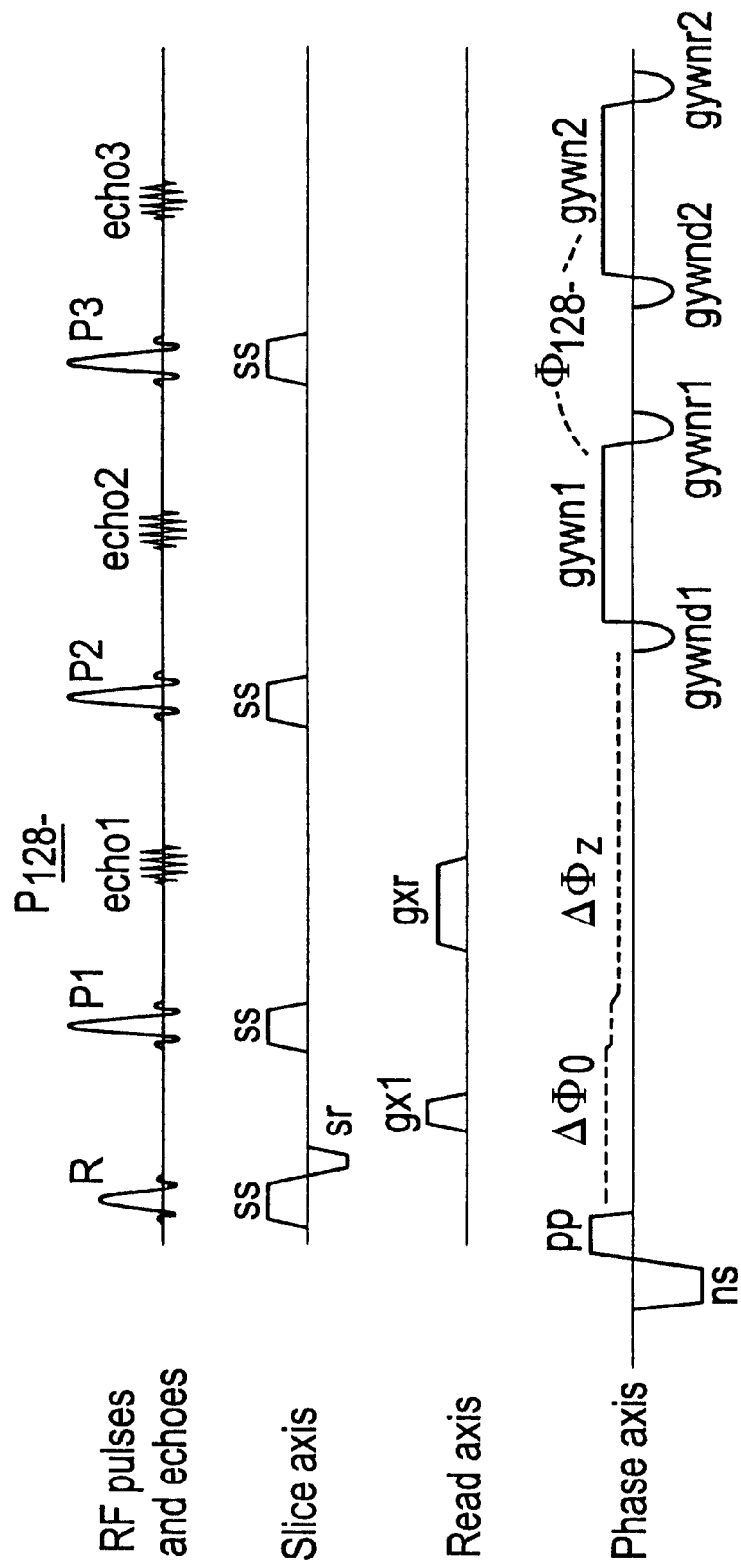
FIG. 3 is an explanatory view showing one phase error measuring pre-scan sequence according to the present invention.

In Step E1, data of echo2 and echo3 are collected in accordance with a phase error measuring pre-scan sequence $P_{128-}$ of encode 0 with a positive stationary or steady-state pre-pulse as shown in FIG. 3.

In the phase error measuring pre-scan sequence $P_{128-}$ shown in FIG. 3, a positive steady-state pre-pulse comprised of a negative saturated pulse ns and a positive steady-state pulse pp having an area equal to one-half that thereof is applied to a phase axis. Next, an excitation pulse R and a slice gradient ss are applied. A first inversion pulse P1 and a slice gradient ss are next applied. Next, a read pulse gxr corresponding to a first half of a normal read pulse (see gxw in FIG. 9) is applied to a read axis. Afterwards, the read pulse is set to "0".

Next, a second inversion pulse P2 and a slice gradient ss are applied. Next, a dephaser pulse gywdn1 is applied to the phase axis. Next, an NMR signal is received from an echo1 while a read pulse gywn1 is being applied to the phase axis. Afterward, a rephaser pulse gywrn1 equal to the dephaser pulse gywdn1 is applied to the phase axis.

Next, a third inversion pulse P3 and a slice gradient ss are applied. A dephaser pulse gywdn2 is next applied to the phase axis. Next, an NMR signal is received from an echo2 while a read pulse gywn2 is being applied to the phase axis. Thereafter, a rephaser pulse gywrn2 equal to the dephaser pulse gywdn2 is applied to the phase axis.

Referring back to FIG. 2, in Step E2, the data of echo2 and echo3 are converted into one-dimensional Fourier form and the resultant respective phases are represented as $\phi 2$ and $\phi 3$ respectively.

In Step E3, $(\phi 2 - \phi 3)/2$ is determined and it is fitted with a linear function to thereby obtain a primary term $d_{128-}$.

In Step E4, a primary amount of phase error $\Phi_{128-}$ is determined from the following equation:

$$\Phi_{128-} = d_{128-} \cdot Xres \cdot 10^6 / (\gamma \cdot fov)$$

where Xres indicates a sampling point number of an echo. Further, γ indicates a magnetic rotating ratio. fov indicates the size (cm) of an imaging field of view.

As is understood from FIG. 3, the amount of phase error $\Phi_{128-}$ includes three factors of $\Delta\Phi_0$, $-\Delta\Phi_z$ and α and can be represented as follows:

$$\Phi_{128-}=\Delta\Phi_0, -\Delta\Phi_z+\alpha$$

Steps E5 through E8 are repeated for n=1+ to 256+.

Figure 4:
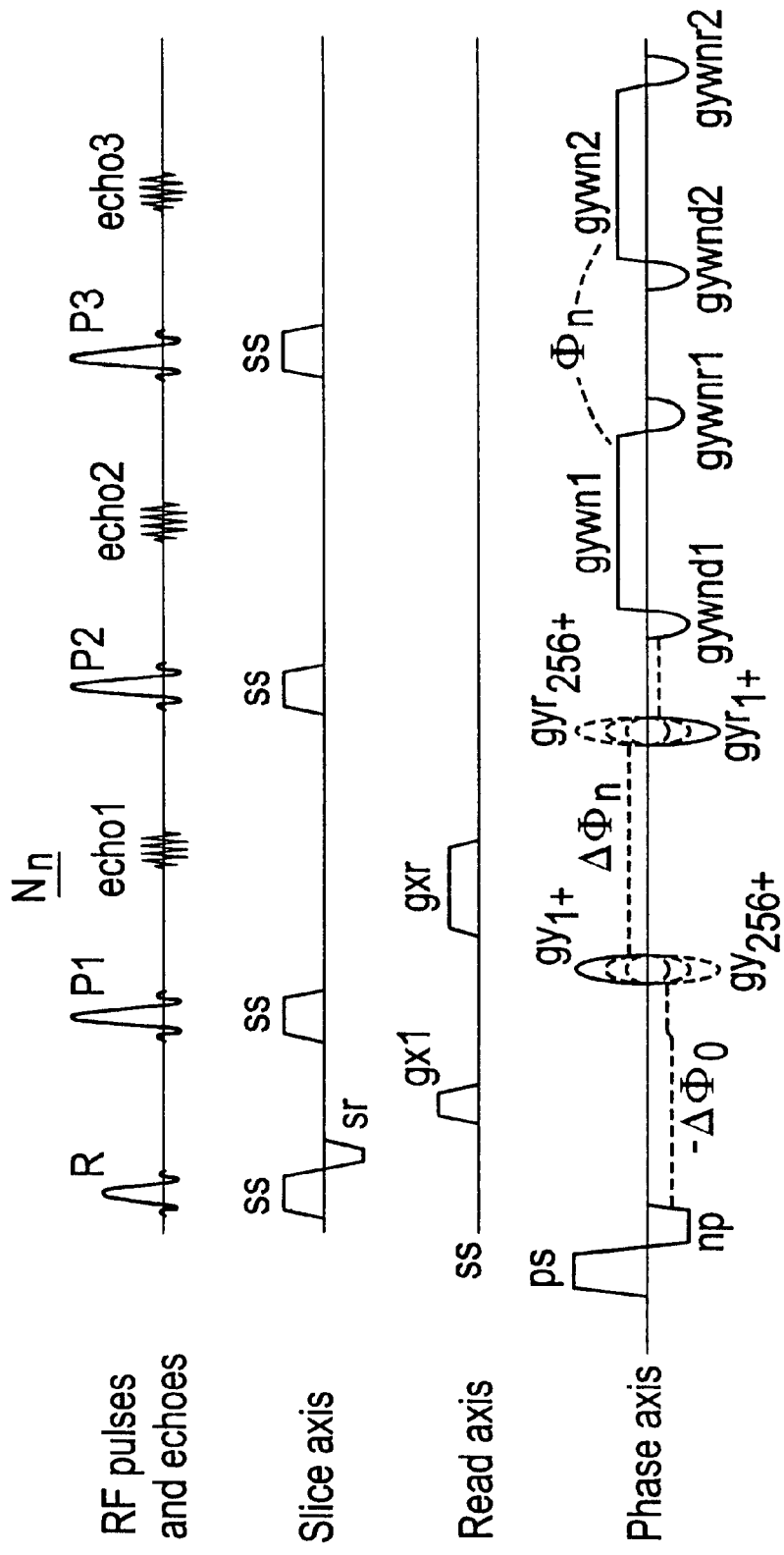
FIG. 4 is an explanatory view depicting another phase error measuring pre-scan sequence according to the present invention.

In Step E5, data of echo2 and echo3 are collected in accordance with a phase error measuring pre-scan sequence $N_n$ of encode 0 with a negative stationary or steady-state pre-pulse as shown in FIG. 4.

In the phase error measuring pre-scan sequence $N_n$ shown in FIG. 4, a negative steady-state pre-pulse comprised of a positive saturated pulse ps and a negative steady-state pulse np having an area equal to one-half that thereof is applied to a phase axis. Next, an excitation pulse R and a slice gradient ss are applied. A first inversion pulse P1 and a slice gradient ss are next applied. Next, a phase encoding pulse gyn (n=1+ to 256+) by which one desires to measure the amount of a phase error, is applied to the phase axis. Next, a read pulse gxr corresponding to the first half of the normal read pulse (see gxw in FIG. 9) is applied to a read axis. Afterwards, the read pulse is set to "0". Next, a rewind pulse gyrn equal in time integrated value and opposite in polarity to the phase encoding pulse gyn is applied to the phase axis.

Next, a second inversion pulse P2 and a slice gradient ss are applied. Next, a dephaser pulse gywdn1 equal to the rewind pulse gyrn is applied to the phase axis. Next, an NMR signal is received from an echo1 while a read pulse gywn1 is being applied to the phase axis. Afterward, a rephaser pulse gywrn1 equal to the dephaser pulse gywdn1 is applied to the phase axis.

Next, a third inversion pulse P3 and a slice gradient ss are applied. Next, a dephaser pulse gywdn2 equal to the rewind pulse gyrn is applied to the phase axis. Next, an NMR signal is received from an echo2 while a read pulse gywn2 is being applied to the phase axis. Afterward, a rephaser pulse gywrn2 equal to the dephaser pulse gywdn2 is applied to the phase axis.

Referring back to FIG. 2, in Step E6, the data of echo2 and echo3 are converted into one-dimensional Fourier form and the resultant respective phases are represented as φ2 and φ3 respectively.

In Step E7, (φ2−φ3)/2 is determined and it is fitted with a linear function to thereby obtain a primary term $d_n$.

In Step E8, aprimary amount of phase error $\Phi_n$ is determined from the following equation:

$$\Phi_n=d_n \cdot Xres \cdot 10^6/(\gamma \cdot fov)$$

where Xres indicates a sampling point number of an echo. Further, γ indicates a magnetic rotating ratio. fov indicates the size (cm) of an imaging field of view.

Figure 5:
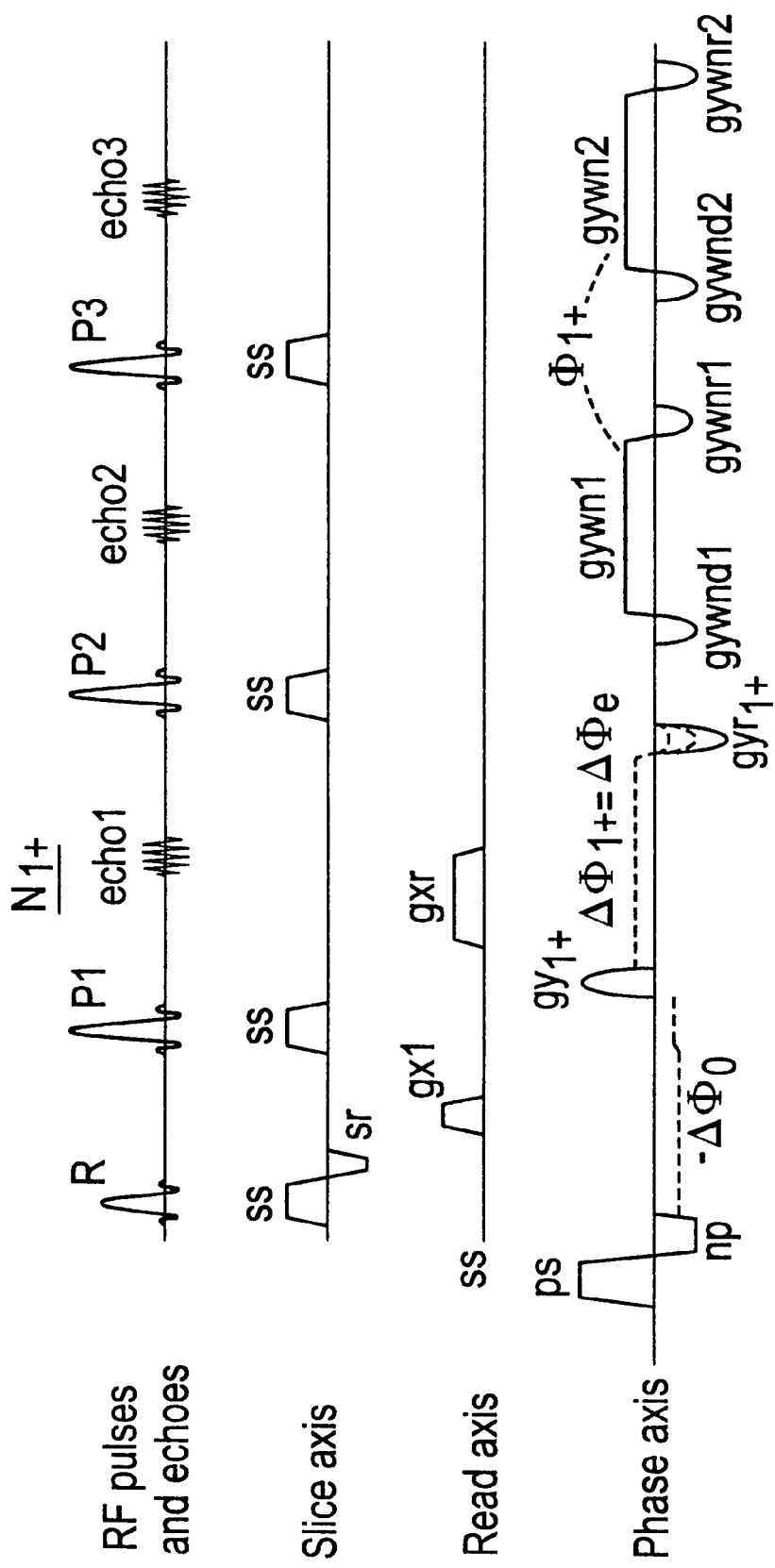
FIG. 5 is an explanatory view showing a further phase error measuring pre-scan sequence according to the present invention.

FIG. 5 shows a phase error measuring pre-scan sequence $N_{1+}$ at n=1+. Assuming that the amount of a phase error $\Delta\Phi_{1+}$ based on a phase encoding pulse $gy_{1+}$ is $\Delta\Phi_e$, the amount of a phase error $\Phi_{1+}$ includes $-\Delta\Phi_0$, $-\Delta\Phi_e$ and α and can be represented as follows:

$$\Phi_{1+}=-\Delta\Phi_0-\Delta\Phi_e+\alpha$$

Figure 6:
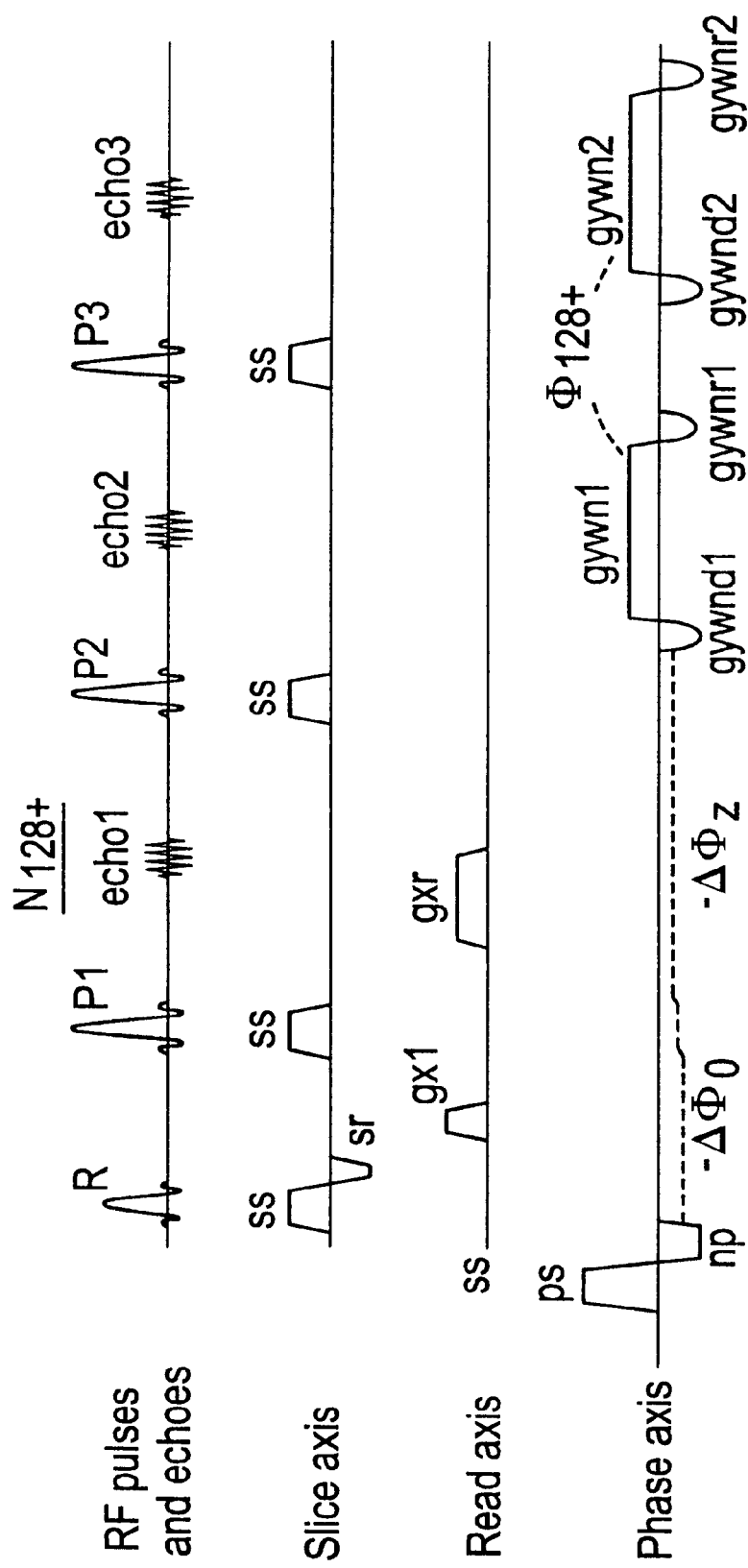
FIG. 6 is an explanatory view illustrating a still further phase error measuring pre-scan sequence according to the present invention.

FIG. 6 shows a phase error measuring pre-scan sequence $N_{128+}$ at n=128+. Assuming that the amount of a phase error from an inversion pulse P1 to an inversion pulse P2 at the time that the amount of phase encode is 0, is defined as $-\Delta\Phi_z$, the amount of a phase error $\Phi_{128+}$ includes $-\Delta\Phi_0$, $\Delta\Phi_z$ and α and can be represented as follows:

$$\Phi_{128+}=-\Delta\Phi_0+\Delta\Phi_z+\alpha$$

Figure 7:
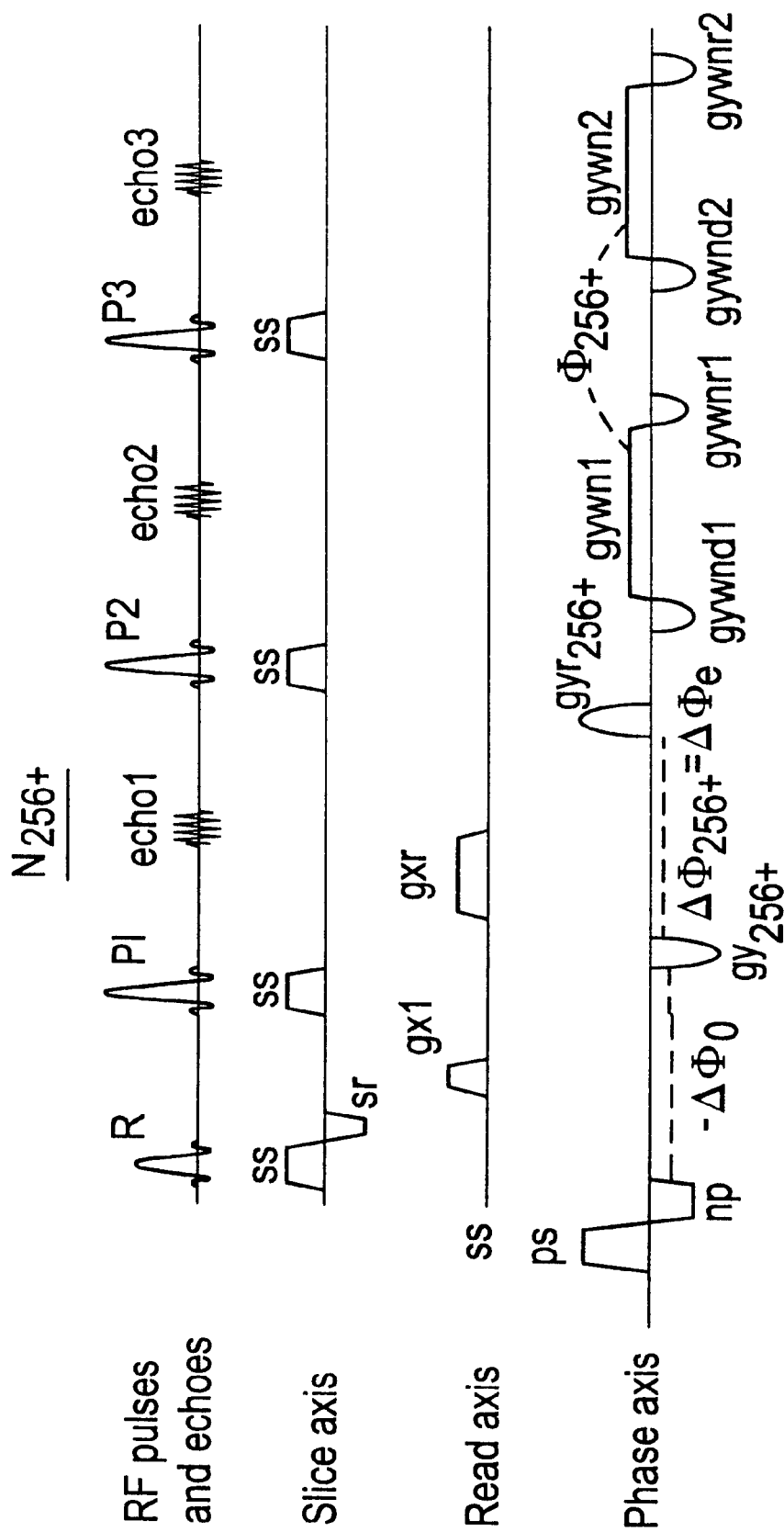
FIG. 7 is an explanatory view depicting a still further phase error measuring pre-scan sequence according to the present invention.

FIG. 7 shows a phase error measuring pre-scan sequence $N_{256+}$ at n=256+. Assuming that the amount of a phase error $\Delta\Phi_{256+}$ based on a phase encoding pulse $gy_{256+}$ is $\Delta\Phi_e$, the amount of a phase error $\Phi_{256+}$ includes $-\Delta\Phi_0$, $\Delta\Phi_e$ and α and can be represented as follows:

$$\Phi_{256+}=-\Delta\Phi_0+\Delta\Phi_e+\alpha$$

Figure 8:
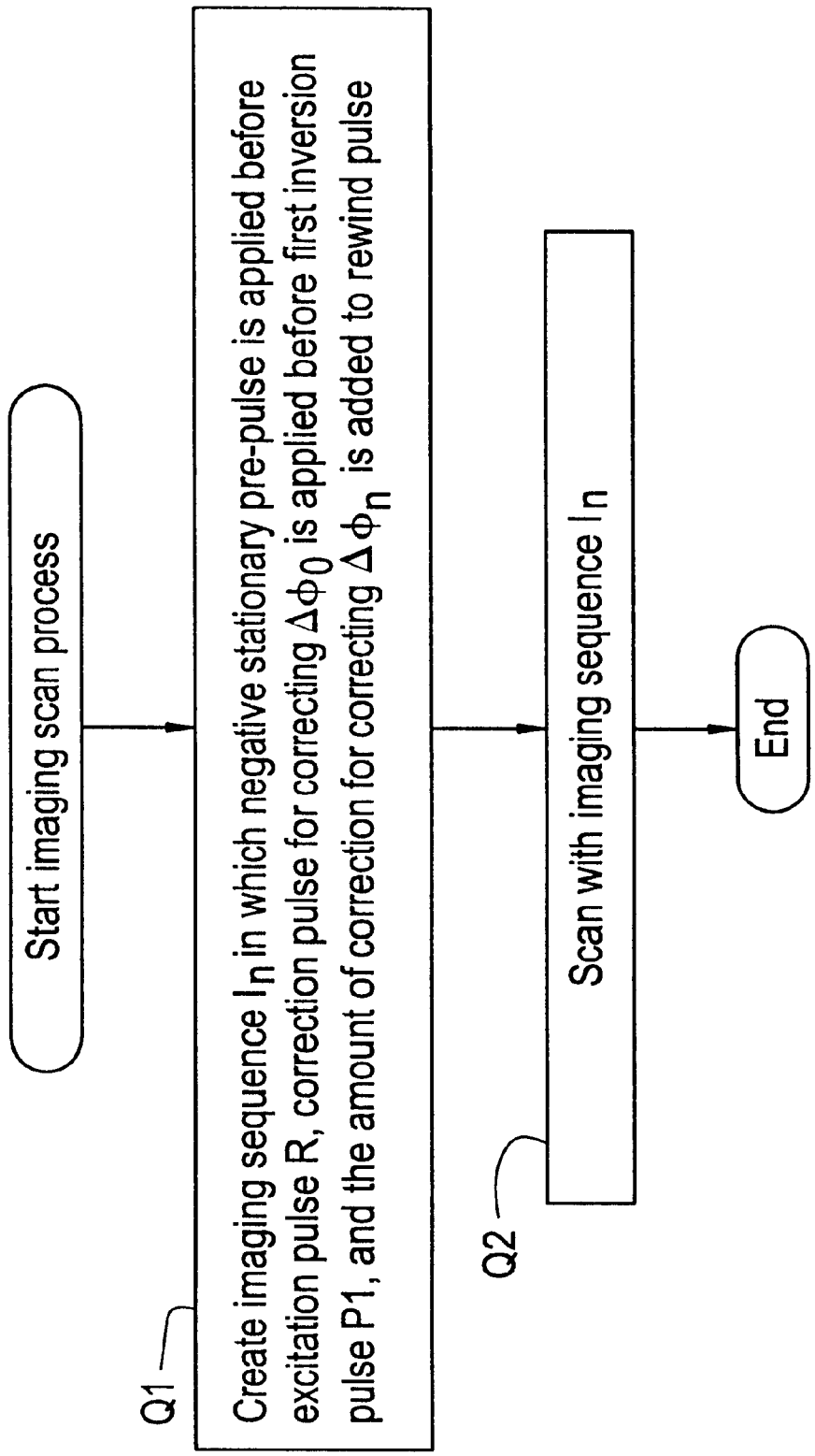
FIG. 8 is a flowchart of an imaging scan process according to a first embodiment of the present invention.

FIG. 8 is a flowchart of an imaging scan according to the first embodiment.

In Step Q1, the computer 7 creates an imaging sequence In and stores it in the sequence storage circuit 6.

Figure 9:
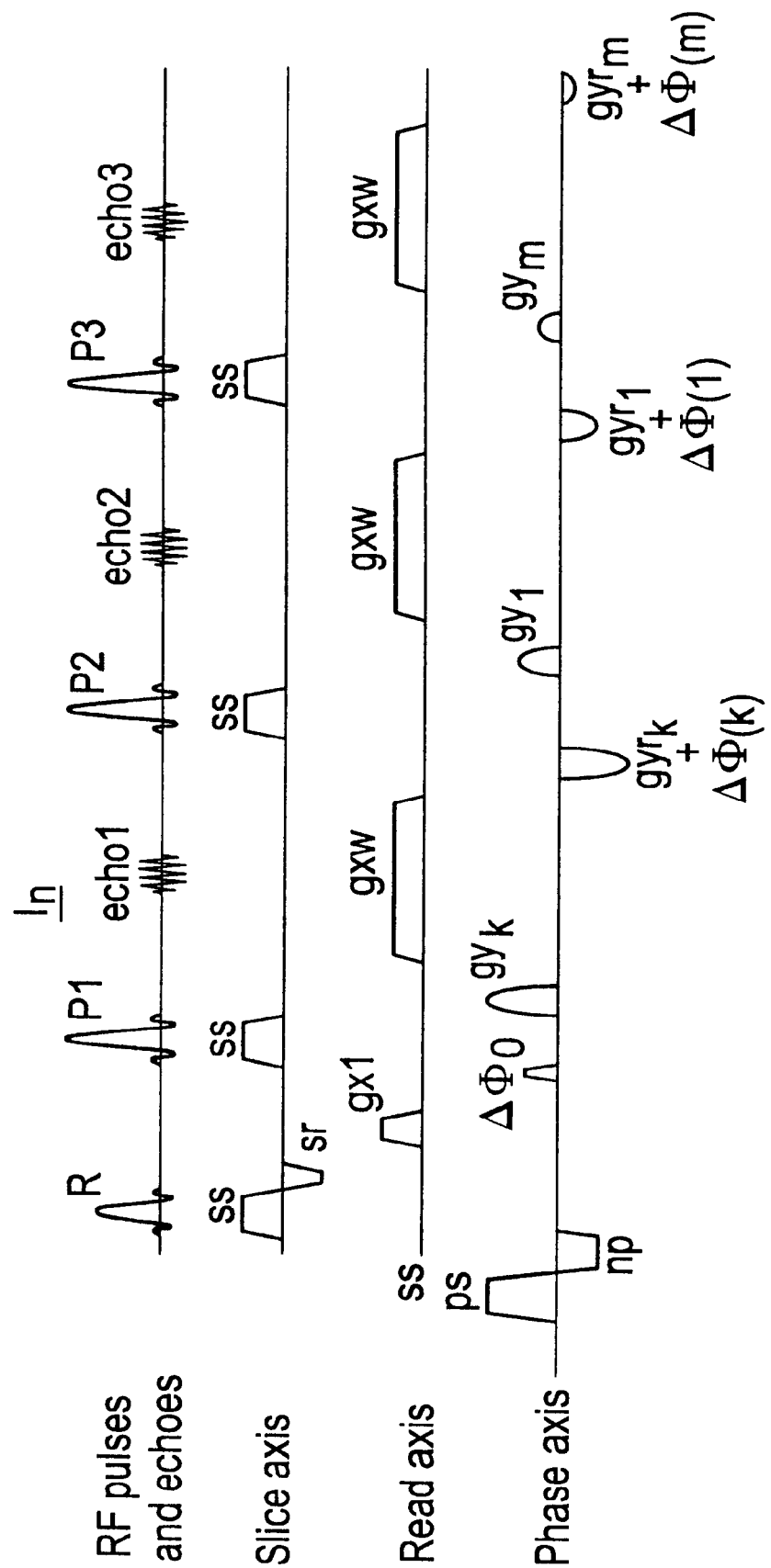
FIG. 9 is an explanatory view showing one example of an imaging sequence according to the first embodiment of the present invention.

As shown in FIG. 9, the imaging sequence In results in an imaging sequence in which in a pulse sequence of a normal high-speed spin echo process, a negative stationary or steady-state pre-pulse (ps, np) is applied in front of an excitation pulse R, a correction pulse for correcting $\Delta\Phi_0$ is applied before a first inversion pulse P1, and the amount of correction for correcting $\Delta\Phi_{(n)}$ is added to a rewind pulse gyr.

Incidentally, $\Delta\Phi_0$ and $\Delta\Phi_{(n)}$ are obtained from the following equations:

$$\Delta\Phi_0=(\Phi_{128-}+\Phi_{128+})/2-(\Phi_{1+}+\Phi_{256+})/2$$

$$\Delta\Phi_{(n)}=(\Phi_{(256-n+1)+}-\Phi_{n+})/2$$

Referring back to FIG. 8, in Step Q2, scan is done with the imaging sequence In shown in FIG. 9 to collect imaging data.

According to the MRI system 100 of the first embodiment as described above, residual magnetization at the commencement of a pulse sequence of a high-speed spin echo process can be defined according to the application of a pre-pulse (ps, np) before an excitation pulse R, whereby a phase error can be corrected by a correction pulse applied before an initial inversion pulse P1. Thus, the influence of the residual magnetization at the commencement of the pulse sequence of the high-speed spin echo process can be restrained, thus making it possible to reduce degradation in image quality. Further, a phase error caused by a phase encoding pulse gy can be corrected by adding the amount of correction to a rewind pulse gyr, whereby degradation in image quality due to it can be reduced.

Incidentally, a correction pulse may be applied after the initial inversion pulse. Further, the amount of correction for correcting a phase error caused by a pre-pulse may be added to the initial inversion pulse P1.

Second Embodiment

Figure 10:
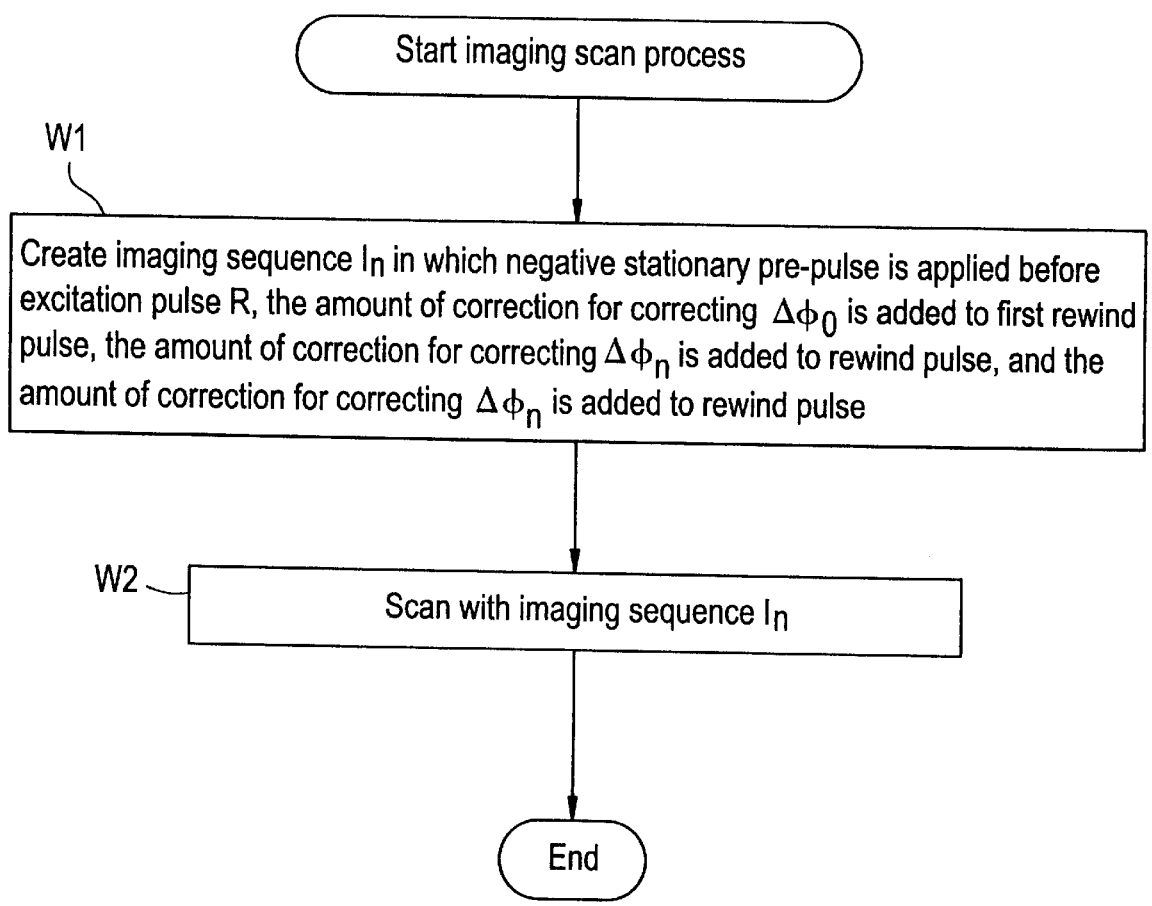
FIG. 10 is a flowchart of an imaging scan process according to a second embodiment of the present invention.

FIG. 10 is a flowchart of an imaging scan according to a second embodiment.

In Step W1, a computer 7 creates an imaging sequence In and stores it in a sequence storage circuit 6.

Figure 11:
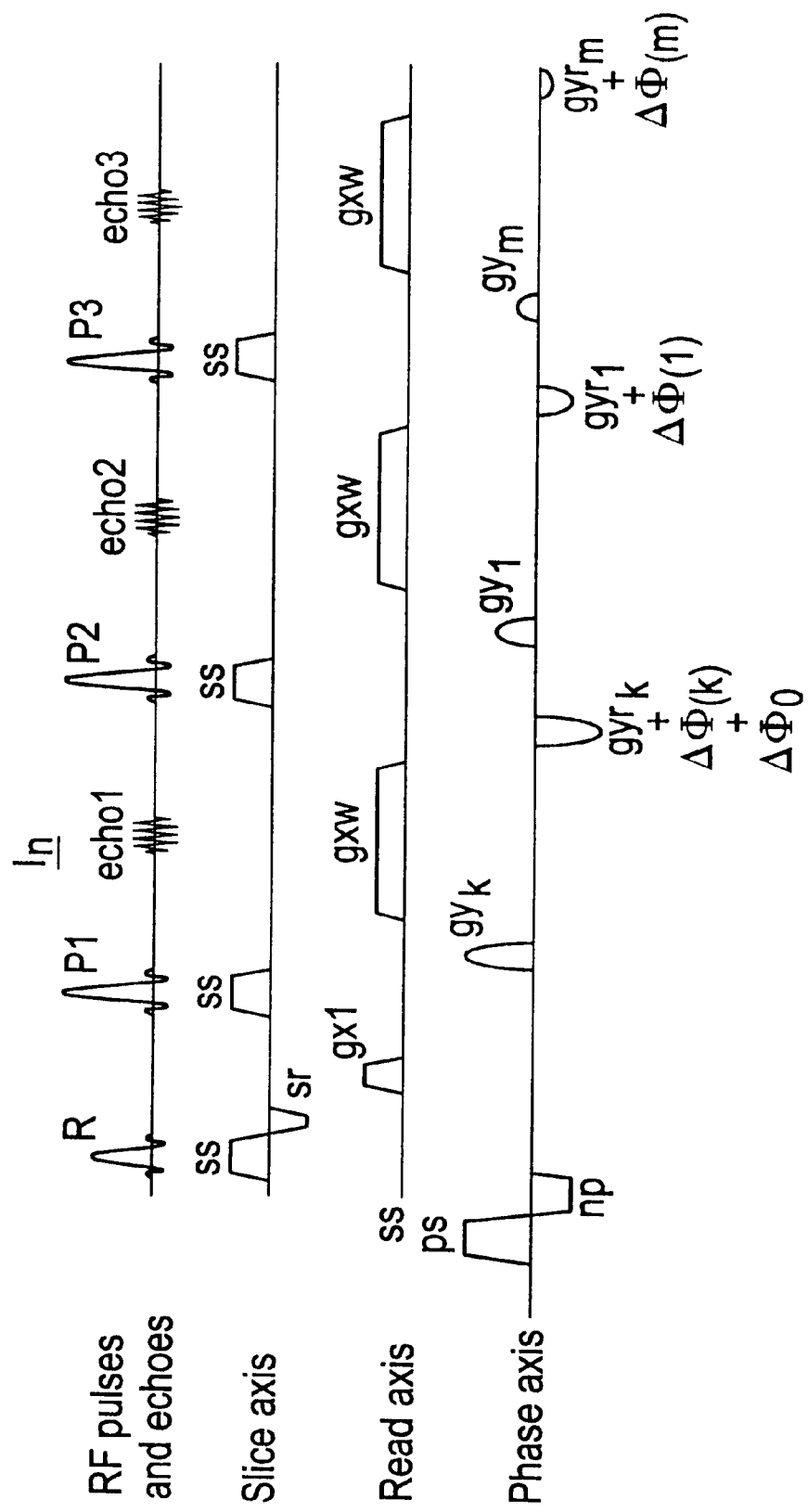
FIG. 11 is an explanatory view illustrating one example of an imaging sequence according to the second embodiment of the present invention.

As shown in FIG. 11, the imaging sequence In results in an imaging sequence in which in the pulse sequence of the normal high-speed spin echo process, a negative stationary or steady-state pre-pulse (ps, np) is applied before an excitation pulse R, the amount of correction for correcting $\Delta\Phi_0$ and the amount of correction for correcting $\Delta\Phi_{(n)}$ are added to an initial rewind pulse gyr, and the amount of correction for correcting $\Delta\Phi_{(n)}$ is added to the subsequent rewind pulse gyr.

Referring back to FIG. 10, in Step W2, scan is done with the imaging sequence In shown in FIG. 11 to collect imaging data.

According to the MRI system of the second embodiment as described above, residual magnetization at the commencement of a pulse sequence of a high-speed spin echo process can be defined according to the application of a pre-pulse (ps, np) before an excitation pulse R, whereby a phase error can be corrected by the amount of correction added to an initial rewind pulse gyr. Thus, the influence of the residual magnetization at the commencement of the pulse sequence of the high-speed spin echo process can be restrained, thus making it possible to reduce degradation in image quality. Further, a phase error caused by a phase encoding pulse gy can be corrected by adding the amount of correction to a rewind pulse gyr, whereby degradation in image quality due to it can be reduced.

Incidentally, the amount of correction for correcting a phase error $\Delta\Phi_0$ caused by the pre-pulse (ps, np) may be added to the initial phase encoding pulse gy.

Many widely different embodiments of the invention may be configured without departing from the spirit and the scope of the present invention is not limited to the specific embodiments described in the specification, except as defined in the appended claims.

What is claimed is:

1. A phase error detection method, comprising the steps of:
    (a) applying a pre-pulse to an arbitrary gradient axis, transmitting an excitation pulse, transmitting a first inversion pulse, subsequently transmitting a second inversion pulse, applying a dephaser pulse to a phase axis, collecting data from echoes while applying a read pulse to said phase axis, applying a rephaser pulse, subsequently transmitting a third inversion pulse, applying a dephaser pulse to said phase axis, collecting data from echoes while applying a read pulse to said phase axis, and determining amount of phase error based on collected data;
    (b) applying a pre-pulse to an arbitrary gradient axis, transmitting an excitation pulse, transmitting a first inversion pulse, applying a phase encoding pulse to a phase axis, applying a rewind pulse to said phase axis, subsequently transmitting a second inversion pulse, applying a dephaser pulse to said phase axis, collecting data from echoes while applying a read pulse to said phase axis, applying a rephaser pulse, subsequently transmitting a third inversion pulse, applying a dephaser pulse to said phase axis, collecting data from echoes while applying a read pulse to said phase axis, and determining amount of phase error based on collected data;
    (c) applying a pre-pulse to an arbitrary gradient axis, transmitting an excitation pulse, transmitting a first inversion pulse, applying a phase encoding pulse opposite in polarity to said step (b) to a phase axis, applying a rewind pulse to said phase axis, subsequently transmitting a second inversion pulse, applying a de-phaser pulse to said phase axis, collecting data from echoes while applying a read pulse to said phase axis, applying a rephaser pulse, subsequently transmitting a third inversion pulse, applying a dephaser pulse to said phase axis, collecting data from echoes while applying a read pulse to said phase axis, and determining amount of phase error based on collected data;
    (d) applying a pre-pulse opposite in polarity to said step (a) to an arbitrary gradient axis, transmitting an excitation pulse, transmitting a first inversion pulse, subsequently transmitting a second inversion pulse, applying a dephaser pulse to a phase axis, collecting data from echoes while applying a read pulse to said phase axis, applying a rephaser pulse, subsequently transmitting a third inversion pulse, applying a dephaser pulse to said phase axis, collecting data from echoes while applying a read pulse to said phase axis, and determining amount of phase error based on collected data; and
    (e) determining amount of phase error caused by said pre-pulse based on amount to phase error obtained from each of above steps (a) to (d).

2. The method of claim 1, wherein amount of phase error caused by a phase encoding pulse is determined based on amount of phase error obtained from each of steps (a) to (d).

3. The method of claim 1, further comprising the step of:
    determining an amount of correction equal to the amount of phase error.

4. The method of claim 1, further comprising the step of:
    determining an amount of correction equal to the amount of phase error.

5. The method of claim 3, wherein said amount of correction is added to a corresponding rewind pulse or phase encoding pulse disposed immediately after said rewind pulse, or is added to a front of or back of a corresponding rewind pulse.

6. The method of claim 4, wherein said amount of correction is added to a corresponding rewind pulse or phase encoding pulse disposed immediately after said rewind pulse or is added to a front of back of a corresponding rewind pulse.

7. The method of claim 5, wherein said amount of correction is applied to a phase axis before or behind an initial inversion pulse or is added to said initial inversion pulse.

8. The method of claim 4, wherein said amount of correction is applied to a phase axis before or behind an initial inversion pulse or is added to said initial inversion pulse.

9. The method of claim 3, wherein said amount of correction is added to an initial phase encoding pulse or is added to an initial rewind pulse.

10. The method of claim 4, wherein said amount of correction is added to an initial phase encoding pulse or is added to an initial rewind pulse.

11. A phase error detection system comprising:
    first means for applying a pre-pulse to an arbitrary gradient axis, transmitting an excitation pulse, transmitting a first inversion pulse, subsequently transmitting a second inversion pulse, applying a dephaser pulse to a phase axis, collecting data from echoes while applying a read pulse to said phase axis applying a rephaser pulse, subsequently transmitting a third inversion pulse, applying a dephaser pulse to said phase axis, collecting data from echoes while applying a read pulse to said phase axis, and determining amount of phase error based on collected data;
    second means for applying a pre-pulse to an arbitrary gradient axis, transmitting an excitation pulse, transmitting a first inversion pulse, applying a phase encoding pulse to a phase axis, applying a rewind pulse to said phase axis, subsequently transmitting a second inversion pulse, applying a dephaser pulse to said phase axis, collecting data from echoes while applying a read pulse to said phase axis, applying a rephaser pulse, subsequently transmitting a third inversion pulse, applying a dephaser pulse to said phase axis, collecting data from echoes while applying a read pulse to said phase axis, and determining amount of phase error based on collected data;

third means for applying a pre-pulse to an arbitrary gradient axis, transmitting an excitation pulse, transmitting a first inversion pulse, applying a phase encoding pulse opposite in polarity to that provided by said second means to a phase axis, applying a rewind pulse to said phase axis, subsequently transmitting a second inversion pulse, applying a dephase pulse to said phase axis, collecting data from echoes while applying a read pulse to said phase axis, applying a rephaser pulse, subsequently transmitting a third inversion pulse, applying a dephaser pulse to said phase axis, collecting data from echoes while applying a read pulse to said phase axis, and determining amount of phase error based on collected data;

fourth means for applying a pre-pulse opposite in polarity to that provided by said first means to an arbitrary gradient axis, transmitting an excitation pulse, transmitting a first inversion pulse, subsequently transmitting a second inversion pulse, applying a dephaser pulse to a phase axis, collecting data from echoes while applying a read pulse to said phase axis, applying a rephaser pulse, subsequently transmitting a third inversion pulse, applying a dephaser pulse to said phase axis, collecting data from echoes while applying a read pulse to said phase axis, and determining amount of phase error based on collected data; and fifth means for determining amount of phase error caused by said pre-pulse based on amount of phase error obtained from each of said first means through fourth means.

12. The system of claim 11, further comprising sixth means for determining amount of phase error caused by a phase encoding pulse based on amount of phase error obtained by said second means and said third means.

13. The system of claim 11, further comprising sixth means for determining amount of correction equal to amount of said phase error.

14. The system of claim 11, further comprising sixth means for determining amount of correction equal to amount of said phase error.

15. The system of claim 13, wherein said sixth means comprises means for adding amount of said correction to a corresponding rewind pulse or phase encoding pulse disposed immediately after said rewind pulse, or for adding to a front of or back of a corresponding rewind pulse.

16. The system of claim 14, wherein said sixth means comprises means for adding amount of said correction to a corresponding rewind pulse or phase encoding pulse disposed immediately after said rewinding pulse, or for adding to a front of or back of a corresponding rewind pulse.

17. The system of claim 13, wherein said sixth means comprises means for applying said amount of correction to a phase axis before or behind an initial inversion pulse or for adding to said initial inversion pulse.

18. The system of claim 14, wherein said sixth means comprises means for applying said amount of correction to a phase axis before or behind an inital inversion pulse or for adding to said initial inversion pulse.

19. The system of claim 13, wherein said sixth means comprises means for adding said amount of correction to an initial phase encoding pulse or to an initial rewind pulse.

20. The system of claim 14, wherein said sixth means comprises means for adding said amount of correction to an initial pahse encoding pulse or to an initial rewind pulse.

* * * * *